(12) United States Patent
Li

(10) Patent No.: US 8,419,822 B2
(45) Date of Patent: *Apr. 16, 2013

(54) METHODS FOR PRODUCING CARBOXYLIC ACID STABILIZED SILVER NANOPARTICLES

(75) Inventor: Yuning Li, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 336 days.

This patent is subject to a terminal disclaimer.

(21) Appl. No.: 12/193,225

(22) Filed: Aug. 18, 2008

(65) Prior Publication Data

US 2010/0040863 A1    Feb. 18, 2010

(51) Int. Cl.
*B22F 9/24* (2006.01)
*B82Y 40/00* (2006.01)

(52) U.S. Cl.
USPC .............................. 75/371; 75/721; 977/896

(58) Field of Classification Search ...................... 75/371
See application file for complete search history.

(56) References Cited

U.S. PATENT DOCUMENTS

| | | | |
|---|---|---|---|
| 6,621,099 B2 | 9/2003 | Ong et al. | |
| 6,770,904 B2 | 8/2004 | Ong et al. | |
| 6,878,184 B1 | 4/2005 | Rockenberger et al. | |
| 6,949,762 B2 | 9/2005 | Ong et al. | |
| 7,270,694 B2 | 9/2007 | Li et al. | |
| 7,306,969 B2 | 12/2007 | Wu et al. | |
| 7,559,970 B2 * | 7/2009 | Kim et al. | 75/711 |
| 7,628,840 B2 * | 12/2009 | Atsuki et al. | 75/717 |
| 2006/0254387 A1 | 11/2006 | Lee et al. | |
| 2007/0003603 A1 * | 1/2007 | Karandikar et al. | 424/443 |
| 2007/0034052 A1 * | 2/2007 | Vanheusden et al. | 75/362 |
| 2009/0029148 A1 * | 1/2009 | Hashimoto et al. | 428/323 |
| 2009/0297830 A1 * | 12/2009 | Pyles et al. | 428/327 |
| 2009/0317289 A1 * | 12/2009 | Ito et al. | 420/461 |

FOREIGN PATENT DOCUMENTS

| | | |
|---|---|---|
| CA | 2521686 | 4/2006 |
| EP | 1579935 A | 9/2005 |
| EP | 1561530 A | 10/2005 |
| EP | 1821316 A | 8/2007 |
| JP | 2006-219693 | 8/2006 |

OTHER PUBLICATIONS

European Search Report dated Dec. 17, 2009.
"Novel preparation of monodispersed silver nanoparticles via amine adducts derived from insoluble silver myristate in tertiary alkylamine," Mari Yamamoto et al., J. Mater. Chem., 2003 13, 2064-2065.
"Organic Thin Film Transistors for Large Area Electronics," Christos D. Dimitrakopoulos et al., Adv. Mater., 14, No. 2, Jan. 16, 2002, pp. 99-117.

* cited by examiner

*Primary Examiner* — George Wyszomierski
(74) *Attorney, Agent, or Firm* — Fay Sharpe LLP

(57) ABSTRACT

Processes for producing carboxylic acid-stabilized silver nanoparticles are disclosed. A reaction mixture comprising a silver salt, a carboxylic acid, and a tertiary amine is heated to form carboxylic acid-stabilized silver nanoparticles.

17 Claims, 4 Drawing Sheets

METHODS FOR PRODUCING CARBOXYLIC ACID STABILIZED SILVER NANOPARTICLES

CROSS REFERENCE TO RELATED PATENTS AND APPLICATIONS

Reference is made to the eight following related and commonly assigned patent applications, all of which are hereby fully incorporated by reference herein:

Yiliang Wu et al., U.S. application Ser. No. 10/733,136, filed Dec. 11, 2003, titled "NANOPARTICLE DEPOSITION PROCESS."

Yuning Li et al., U.S. Pat. No. 7,270,694, titled "STABILIZED SILVER NANOPARTICLES AND THEIR USE."

Yiliang Wu et al., U.S. Pat. No. 7,306,969, titled "METHODS TO MINIMIZE CONTACT RESISTANCE."

Yuning Li et al., U.S. application Ser. No. 11/543,661, filed Oct. 5, 2006, titled "SILVER-CONTAINING NANOPARTICLES WITH REPLACEMENT STABILIZER."

Yuning Li et al., U.S. application Ser. No. 11/611,228, filed Dec. 15, 2006, titled "DEVICES CONTAINING ANNEALED STABILIZED SILVER NANOPARTICLES."

Yuning Li et al., U.S. application Ser. No. 11/837,023, filed Aug. 10, 2007, titled "STABILIZED SILVER NANOPARTICLES AND THEIR USE."

Yuning Li et al., U.S. application Ser. No. 11/946,923, filed Nov. 29, 2007, titled "SILVER NANOPARTICLE COMPOSITIONS."

Yuning Li et al., U.S. application Ser. No. 12/193,203, filed Aug. 8, 2008, titled "SILVER NANOPARTICLES AND PROCESS FOR PRODUCING SAME", now U.S. Pat. No. 8,298,314.

BACKGROUND

Disclosed herein, in various embodiments, are stable, high performing nanoparticle compositions as well as processes and devices for making and/or using the same.

Fabrication of electronic circuit elements using liquid deposition techniques may be beneficial as such techniques provide potentially low-cost alternatives to conventional mainstream amorphous silicon technologies for electronic applications such as thin film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing, and cost requirements for practical applications have been a great challenge. The metal, silver, is of particular interest as conductive elements for electronic devices because silver is much lower in cost than gold and it possesses much better environmental stability than copper. There is therefore a critical need, addressed by embodiments of the present disclosure, for lower cost methods for preparing liquid processable, stable silver-containing nanoparticle compositions that are suitable for fabricating electrically conductive elements of electronic devices.

BRIEF DESCRIPTION

The present application discloses, in various exemplary embodiments, processes for preparing silver-containing nanoparticle compositions, as well as the compositions so produced. Devices which use the nanoparticle compositions, such as thin film transistors, are also disclosed.

In some embodiments, a process for producing carboxylic acid-stabilized silver nanoparticles comprises:

forming a mixture comprising a silver salt, a carboxylic acid, and a tertiary amine; and heating the mixture to form carboxylic acid-stabilized silver nanoparticles.

The silver salt may be selected from the group consisting of silver acetate, silver nitrate, silver acetylacetonate, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate.

The carboxylic acid may have at least 4 carbon atoms or from 4 to about 20 carbon atoms. Such carboxylic acids may include butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, and palmitoleic acid.

The tertiary amine may contain one, two, or more amine groups of:

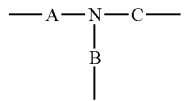

wherein A, B, and C are an organic group.

More specifically, the tertiary amine may be of the formula $NR^1R^2R^3$ or $R^1R^2N—R^5—NR^3R^4$, wherein $R^1$, $R^2$, $R^3$, $R^4$, and $R^5$ are independently selected from alkyl, aryl, substituted alkyl, and substituted aryl.

Exemplary tertiary amines include triethylamine, tripropylamine, tributylamine, tripentylamine, trihexylamine, triheptylamine, trioctylamine, triphenylamine, N,N,N',N'-tetramethylethylenediamine, N,N,N',N'-tetramethylpropane-1,3-diamine, and N,N,N',N'-tetramethylbutane-1,4-diamine, and the like, or mixtures thereof.

The molar ratio of carboxylic acid to silver salt may be from about 0.05 to about 10, or from about 0.1 to about 5. The molar ratio of tertiary amine to silver salt may be from about 1 to about 5000, or from about 10 to about 1000.

The mixture may be heated at a temperature of from about 50° C. to about 200° C., or about 60° C. to about 150° C. The mixture may be heated for a period of from about 5 minutes to about 24 hours, or from about 1 hour to about 8 hours.

The resulting nanoparticles may have an average diameter of from about 0.5 nanometers to about 1000 nanometers.

The process may further comprises the steps of:

separating the silver nanoparticles from the mixture with a first non-solvent; and washing the silver nanoparticles with a second non-solvent.

Such non-solvents may include methanol, ethanol, propanol, isopropanol, acetone, and N,N-dimethylformamide.

Carboxylic acid-stabilized silver nanoparticles resulting from such processes are also disclosed. Also disclosed are thin-film transistors produced by depositing the carboxylic acid-stabilized silver nanoparticles and then heating.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
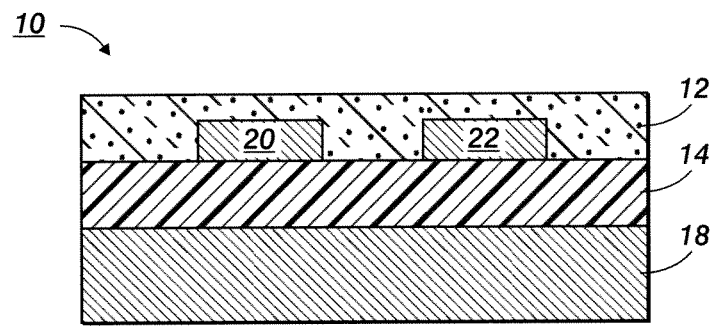
FIG. 1 represents a first embodiment of a thin film transistor containing nanoparticles of the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "nano" as used in "silver-containing nanoparticles" indicates a particle size of less than about 1000 nm. In embodiments, the silver-containing nanoparticles have a particle size of from about 0.5 nm to about 1000 nm, from about 1 nm to about 500 nm, from about 1 nm to about 100 nm, and particularly from about 1 nm to about 20 nm. Unless otherwise indicated, the particle sizes described herein are for silver-containing nanoparticles having the carboxylic acid stabilizer on the surface. The particle size is defined herein as the average diameter of the silver-containing particles, excluding the carboxylic acid stabilizer, as determined by TEM (transmission electron microscopy).

The processes of the present disclosure produce carboxylic acid-stabilized silver nanoparticles. The processes comprise (a) forming a mixture comprising a silver salt, a carboxylic acid, and a tertiary amine; and (b) heating the mixture to form such carboxylic acid-stabilized silver nanoparticles.

The silver salt may be selected from the group consisting of silver acetate, silver nitrate, silver acetylacetonate, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate.

The carboxylic acid used in the mixture has at least 4 carbon atoms. In further specific embodiments, the carboxylic acid has from 4 to about 20 carbon atoms. Exemplary carboxylic acids include butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, and palmitoleic acid. Nanoparticles having carboxylic acids with less than 12 carbon atoms are less soluble in an organic solvent than those with 12 or more carbon atoms.

The tertiary amine is used as both the solvent and a reducing agent. Tertiary amines are used because, in contrast with primary and secondary amines, they cannot react with the carboxylic acid. Another advantage of using a tertiary amine is that tertiary amines are typically not dangerous or toxic. By contrast, prior methods of forming silver nonparticles used hydrazine or phenylhydrazine, which are dangerous and toxic compounds.

In some embodiments, the tertiary amine contains one, two, or more amine groups of:

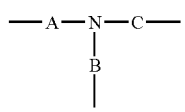

wherein A, B, and C are an organic group. When the tertiary amine contains more than one such amine group, the nitrogen atoms are not directly bonded to each other. Exemplary organic groups include alkyl, aryl, substituted alkyl, and substituted aryl.

In other embodiments, the tertiary amine may be described by one of the formulas:

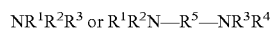

wherein $R^1$, $R^2$, $R^3$, $R^4$, and $R^5$ are independently selected from alkyl, aryl, substituted alkyl, and substituted aryl. Generally, the alkyl group will have from 1 to about 18 carbon atoms and the aryl groups will have from 6 to about 20 carbon atoms. The alkyl and aryl groups may be substituted with groups such as halogen, hydroxyl, nitro ($-NO_2$), alkoxy, mercapto ($-SH$), etc.

Exemplary tertiary amines include triethylamine, tripropylamine, tributylamine, tripentylamine, trihexylamine, triheptylamine, trioctylamine, triphenylamine, N,N,N',N'-tetramethylethylenediamine, N,N,N',N'-tetramethylpropane-1,3-diamine, and N,N,N',N'-tetramethylbutane-1,4-diamine. Hydrazine is not considered an amine because it contains a nitrogen-nitrogen bond.

In embodiments, the molar ratio of carboxylic acid to silver salt is from about 0.05 to about 10. In more specific embodiments, the molar ratio of carboxylic acid to silver salt is from about 0.1 to about 10, including from about 0.1 to 5.

In embodiments, the molar ratio of tertiary amine to silver salt is from about 1 to about 5000. In more specific embodiments, the molar ratio of silver salt to tertiary amine is from about 10 to about 1000.

The mixture may be heated at a temperature of from about 50° C. to about 200° C. In more specific embodiments, the mixture is heated to a temperature of from about 60° C. to about 150° C.

The mixture may be heated for a period of from about 5 minutes to about 24 hours. In more specific embodiments, the mixture is heated for a period of from about 1 hour to about 8 hours. Generally, the mixture is heated at atmospheric pressure.

The resulting nanoparticles have an average diameter of from about 0.5 nanometers to about 1000 nanometers. In more specific embodiments, the nanoparticles have an average diameter of from about 1 nanometer to about 100 nanometers.

As desired, the silver nanoparticles may be separated from the reaction mixture by using a non-solvent, i.e. a liquid in which the silver nanoparticles are not soluble. The silver nanoparticles may then be washed with a non-solvent. Exemplary non-solvents include methanol, ethanol, propanol, isopropanol, acetone, and N,N-dimethylformamide.

The processes of the present disclosure allow for a one-step process of making carboxylic acid-stabilized silver nanoparticles. In contrast, prior methods involved the formation of an amine-stabilized silver nanoparticle in a dangerous and toxic solvent like hydrazine, then replacing the amine with a carboxylic acid.

In embodiments, the silver-containing nanoparticles are composed of elemental silver or a silver composite. Besides silver, the silver composite may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising, for example, at least about 20% of the nanoparticles by weight, particularly greater than about 50% of the nanoparticles by weight.

In embodiments, further processing of the silver nanoparticles (with the carboxylic acid on the surface thereof) may occur such as, for example, making them compatible with a liquid deposition technique (e.g., for fabricating an electronic device). Such further processing of the composition may be, for instance, dissolving or dispersing the silver nanoparticles in an appropriate liquid.

The liquid that can be used to disperse or dissolve silver nanoparticles to form a silver nanoparticle composition includes organic liquids or water. Exemplary organic liquids include hydrocarbon solvents such as pentane, hexane, cyclohexane, heptane, octane, nonane, decane, undecane, dodecane, tridecane, tetradecane, toluene, xylene, mesitylene, and the like; alcohols such as butanol, pentanol, hexanol, heptanol, octanol, and the like; tetrahydrofuran; chlorobenzene; dichlorobenzene; trichlorobenzene; nitrobenzene; cyanobenzene; acetonitrile; and mixtures thereof. One, two, three or more liquids may be used. In embodiments where two or more solvents are used, each solvent may be present at any suitable volume ratio or molar ratio such as for example from about 99:1 to about 1:99.

The fabrication of conductive elements from the silver nanoparticles can be carried out in embodiments using any suitable liquid deposition technique including i) printing such as screen/stencil printing, stamping, microcontact printing, ink jet printing and the like, and ii) coating such as spin-coating, dip coating, blade coating, casting, dipping, and the like. The deposited silver nanoparticles at this stage may or may not exhibit electrical conductivity.

Heating the deposited nanoparticles at a temperature of below about 300° C., preferably at or below about 250° C. causes them to coalesce to form electrically conductive layers which are suitable for use as conductive elements in electronic devices. The heating is performed for a time ranging from for example about one minute to about 10 hours, particularly from about 5 minutes to about 1 hour. The heating can be done at a temperature of from about 100° C. to about 300° C. In more specific embodiments, the heating is performed at a temperature of from about 150° C. to about 200° C. or from about 170° C. to about 190° C.

The conductivity of the resulting silver-containing elements produced by heating the deposited silver nanoparticles is, for example, at least one thousand S/cm. In other embodiments, the conductivity is at least ten thousand S/cm as measured by four-probe method.

The resulting conductive elements can be used as conductive electrodes, conductive pads, conductive lines, conductive tracks, and the like in electronic devices such as a thin film transistor, organic light emitting diodes, RFID (radio frequency identification) tags, photovoltaic, and other electronic devices which require conductive elements or components.

In FIG. 1, there is schematically illustrated a thin film transistor ("TFT") configuration 10 comprised of a heavily n-doped silicon wafer 18 which acts as both a substrate and a gate electrode, a thermally grown silicon oxide dielectric insulating layer 14 on top of which are deposited two metal contacts, source electrode 20 and drain electrode 22. Over and between the metal contacts 20 and 22 is a semiconductor layer 12 as illustrated herein.

Figure 2:
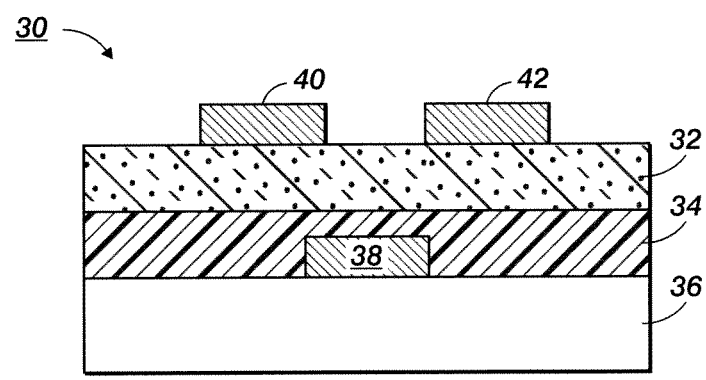
FIG. 2 represents a second embodiment of a thin film transistor containing nanoparticles of the present disclosure.

FIG. 2 schematically illustrates another TFT configuration 30 comprised of a substrate 36, a gate electrode 38, a source electrode 40 and a drain electrode 42, an insulating dielectric layer 34, and a semiconductor layer 32.

Figure 3:
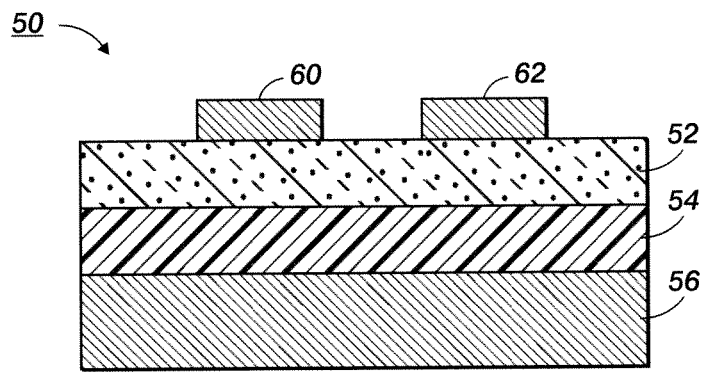
FIG. 3 represents a third embodiment of a thin film transistor containing nanoparticles of the present disclosure.

FIG. 3 schematically illustrates a further TFT configuration 50 comprised of a heavily n-doped silicon wafer 56 which acts as both a substrate and a gate electrode, a thermally grown silicon oxide insulating dielectric layer 54, and a semiconductor layer 52, on top of which are deposited a source electrode 60 and a drain electrode 62.

Figure 4:
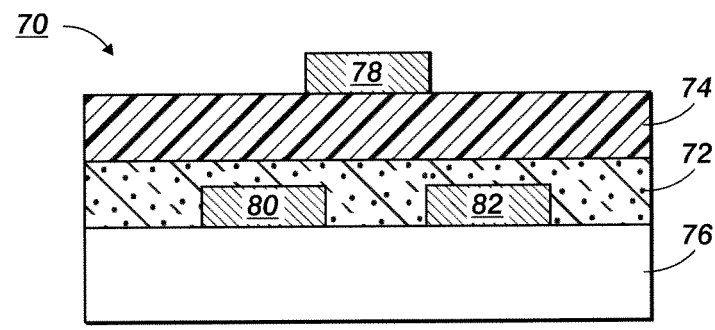
FIG. 4 represents a fourth embodiment of a thin film transistor containing nanoparticles of the present disclosure.

FIG. 4 schematically illustrates an additional TFT configuration 70 comprised of substrate 76, a gate electrode 78, a source electrode 80, a drain electrode 82, a semiconductor layer 72, and an insulating dielectric layer 74.

The substrate may be composed of, for instance, silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present disclosure. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating dielectric layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in U.S. Pat. Nos. 6,621,099; 6,770,904; and 6,949,762; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference. The silver nanoparticles can be deposited as a layer upon any suitable surface, such as the substrate, the dielectric layer, or the semiconductor layer.

The following examples are for purposes of further illustrating the present disclosure. The examples are merely illustrative and are not intended to limit devices made in accordance with the disclosure to the materials, conditions, or process parameters set forth therein.

EXAMPLES

Example 1

Silver acetate (0.84 g, 5 mmol), oleic acid (2.82 g, 10 mmol), and triethylamine (10 g) were heated at 80° C. for 2 hours. After cooling to room temperature, the reaction mixture was added to stirring methanol (200 mL). The precipitate was collected by filtration, washed with methanol, and dried under vacuum.

Yield: 0.61 g (96%, based on silver content of 86% from TGA analysis).

Example 2

Silver nitrate (0.77 g, 4.5 mmol), oleic acid (2.82 g, 10 mmol), and triethylamine (10 g) were heated at 80° C. for 2 hours. After cooling to room temperature, the reaction mixture was added to stirring methanol (200 mL). The precipitate was collected by filtration, washed with methanol, and dried under vacuum.

Yield: 0.56 g (92%, based on silver content of 80% from TGA analysis).

Comparative Example

Two-Step Synthesis of Acid-Stabilized Silver Nanoparticles:

a. Synthesis of Oleylamine-Stabilized Silver Nanoparticles

Silver acetate (3.34 g, 20 mmol) and oleylamine (13.4 g, 50 mmol) were dissolved in 40 mL toluene and stirred at 55° C. for 5 minutes. Phenylhydrazine (1.19 g, 11 mmol) solution in toluene (10 mL) was added into above solution drop-wise with vigorous stirring. The solution became a dark red-brown color. The solution was stirred at 55° C. for another 10 minutes, then added drop-wise to a mixture of acetone/methanol (150 mL/150 mL). The precipitate was filtered and washed briefly with acetone and methanol. A gray solid was obtained.

b. Synthesis of Oleic Acid-Stabilized Silver Nanoparticles

The amine-stabilized silver nanoparticles prepared above were dissolved in 50 mL of hexane, which was added drop-wise to a solution of oleic acid (14.12 g, 50 mmol) in hexane (50 mL) at room temperature. After 30 minutes, hexane was removed and the residue was poured into a stirring methanol (200 mL). After filtration, washing with methanol, and drying (in vacuo), a gray solid was obtained.

Yield: 3.05 g (96%, based on silver content of 68% from TGA analysis).

Results

Figure 5:
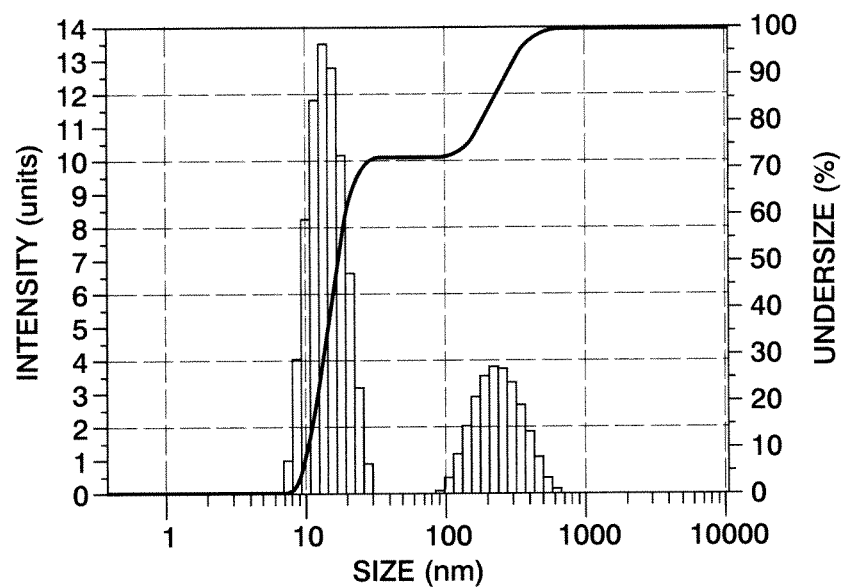
FIG. 5 is a graph showing the particle sizes and distributions of nanoparticles formed according to a first exemplary embodiment of the present disclosure.
Figure 6:
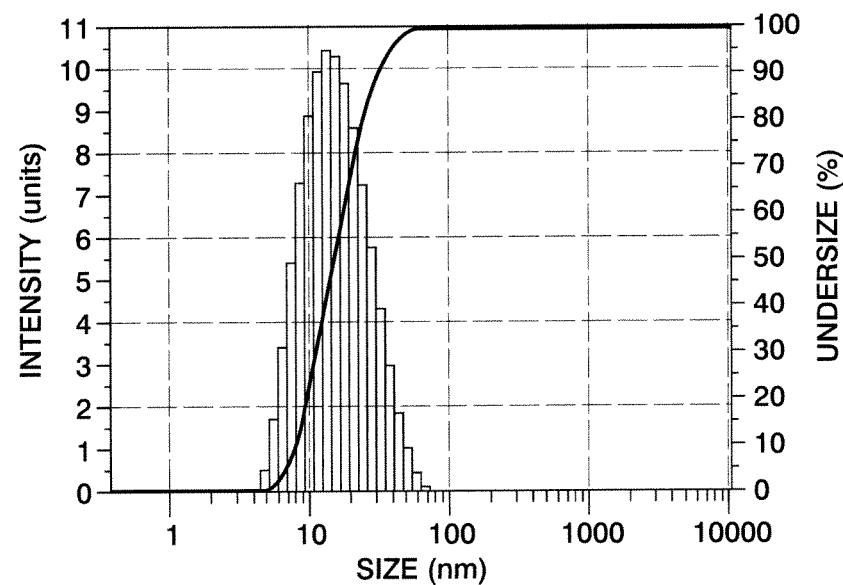
FIG. 6 is a graph showing the particle sizes and distributions of nanoparticles formed according to a second exemplary embodiment of the present disclosure.
Figure 7:
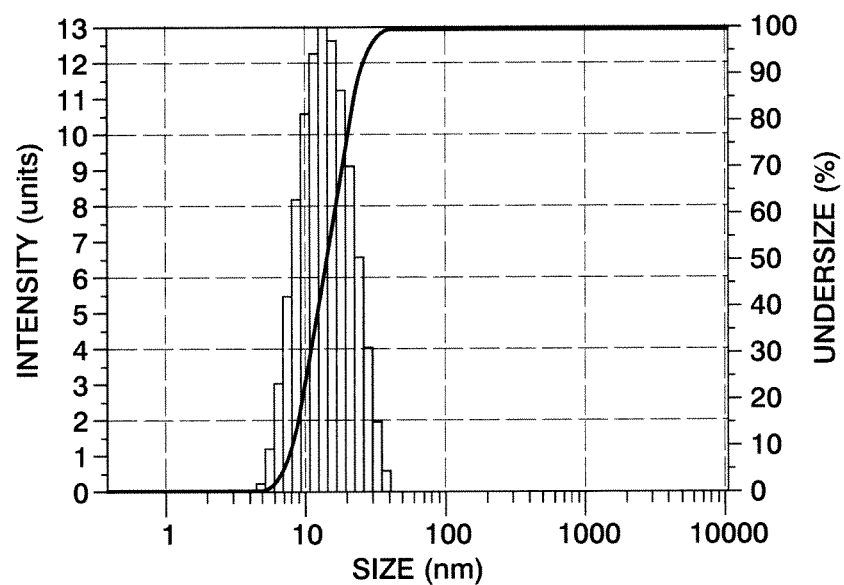
FIG. 7 is a graph showing the particle sizes and distributions of nanoparticles formed according to a prior method.

The size of the silver nanoparticles and their distribution were measured using 0.1 wt % heptane solution of silver nanoparticles on a Zetasizer™. The results are shown in FIGS. 5, 6, and 7 as noted below. In the graphs, the intensity referred to the strength of the signal and corresponded to the relative amount of nanoparticles at the given particle size. The undersize percentage (on the right hand of the graph) referred to the total percentage of nanoparticles having a particle size below the given particle size. The silver nanoparticles of Example 2 had particle sizes and distribution similar to that of the Comparative Example. For Example 1, the particles were distributed in two peaks.

The results of Example 1 are seen in FIG. 5. Example 1 formed silver nanoparticles with a Z-average particle size of 19.5 nm.

The results of Example 1 are seen in FIG. 6. Example 2 formed silver nanoparticles with a Z-average particle size of 14.2 nm.

The results of the Comparative Example are seen in FIG. 7. The Comparative Example formed silver nanoparticles with a Z-average particle size of 12.7 nm.

Conductivity

The conductivity of the silver nanoparticles was then measured by forming a thin film from each Example. A silver nanoparticle solution (15 wt %) in heptane was filtered using a 0.2 micron filter and spin-coated on a glass substrate at a speed of 1000 rpm for 120 seconds. The substrate, with a thin layer of dark brown silver nanoparticles, was heated at 210° C. on a hotplate in air for 30 minutes. A shiny silver thin film was then obtained. The conductivity of the silver thin films was measured using a conventional four-probe technique. The results are summarized in table 1.

TABLE 1

| Example | Conductivity ($\times 10^4$ S/cm) |
| --- | --- |
| Example 1 | 2.3 |
| Example 2 | 3.1 |
| Comparative | 2.8 |

As shown in Table 1, the conductivity of silver nanoparticles made according to the present disclosure is similar to those made using previous methods.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A process for producing carboxylic acid-stabilized silver nanoparticles, comprising:
   forming a mixture comprising a silver salt, a carboxylic acid, and a tertiary amine; and
   heating the mixture to form carboxylic acid-stabilized silver nanoparticles; and
   wherein the tertiary amine is N,N,N',N'-tetramethylpropane-1,3-diamine and/or N,N,N',N'-tetramethylbutane-1,4-diamine.

2. A process for producing carboxylic acid-stabilized silver nanoparticles, comprising:
   forming a mixture comprising a silver salt, a carboxylic acid, and a tertiary amine; and
   heating the mixture to form carboxylic acid-stabilized silver nanoparticles;
   wherein the silver salt is selected from the group consisting of silver acetate, silver nitrate, silver acetylacetonate, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate; and
   wherein the tertiary amine is N,N,N',N'-tetramethylpropane-1,3-diamine and/or N,N,N',N'-tetramethylbutane-1,4-diamine.

3. The process of claim 2, wherein the carboxylic acid has at least 4 carbon atoms.

4. The process of claim 2, wherein the carboxylic acid has from 4 to about 20 carbon atoms.

5. The process of claim 2, wherein the carboxylic acid is selected from the group consisting of butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, and palmitoleic acid.

6. The process of claim 2, wherein the molar ratio of carboxylic acid to silver salt is from about 0.05 to about 10.

7. The process of claim 2, wherein the molar ratio of carboxylic acid to silver salt is from about 0.1 to about 5.

8. The process of claim 2, wherein the molar ratio of tertiary amine to silver salt is from about 1 to about 5000.

9. The process of claim 2, wherein the molar ratio of tertiary amine to silver salt is from about 10 to about 1000.

10. The process of claim 2, wherein the mixture is heated at a temperature of from about 50° C. to about 200° C.

11. The process of claim 2, wherein the mixture is heated at a temperature of from about 60° C. to about 150° C.

12. The process of claim 2, wherein the mixture is heated for a period of from about 5 minutes to about 24 hours.

13. The process of claim 2, wherein the mixture is heated for a period of from about 1 hour to about 8 hours.

14. The process of claim 2, wherein the resulting nanoparticles have an average diameter of from about 0.5 nanometers to about 1000 nanometers.

15. The process of claim 2, further comprising the steps of:
   separating the silver nanoparticles from the mixture with a first non-solvent; and
   washing the silver nanoparticles with a second non-solvent.

16. The process of claim 15, wherein the first and second non-solvents independently comprise methanol, ethanol, propanol, isopropanol, acetone, or N,N-dimethylformamide.

17. A process for producing carboxylic acid-stabilized silver nanoparticles, comprising:
   forming a mixture comprising a silver salt, a carboxylic acid, and a tertiary amine; and
   heating the mixture to form carboxylic acid-stabilized silver nanoparticles;
   wherein the silver salt is selected from the group consisting of silver acetate, silver nitrate, silver acetylacetonate, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate;
   wherein the carboxylic acid is selected from the group consisting of linoleic acid and palmitoleic acid; and
   wherein the tertiary amine is N,N,N',N'-tetramethylpropane-1,3-diamine and/or N,N,N',N'-tetramethylbutane-1,4-diamine.

* * * * *